(12) United States Patent
Ontalus et al.

(10) Patent No.: US 9,349,749 B2
(45) Date of Patent: May 24, 2016

(54) SEMICONDUCTOR DEVICE INCLUDING SIU BUTTED JUNCTION TO REDUCE SHORT-CHANNEL PENALTY

(71) Applicant: GLOBALFOUNDRIES Inc., Grand Cayman (KY)

(72) Inventors: Viorel Ontalus, Danbury, CT (US); Robert R. Robison, Colchester, VT (US); Xin Wang, Beacon, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 14/832,166

(22) Filed: Aug. 21, 2015

(65) Prior Publication Data

US 2015/0364491 A1  Dec. 17, 2015

Related U.S. Application Data

(62) Division of application No. 14/047,189, filed on Oct. 7, 2013, now Pat. No. 9,165,944.

(51) Int. Cl.
*H01L 21/331* (2006.01)
*H01L 27/12* (2006.01)
(Continued)

(52) U.S. Cl.
CPC ............ *H01L 27/1203* (2013.01); *H01L 21/84* (2013.01); *H01L 27/1211* (2013.01); *H01L 29/0649* (2013.01); *H01L 29/1095* (2013.01); *H01L 29/66772* (2013.01);
(Continued)

(58) Field of Classification Search
CPC ................ H01L 21/823412; H01L 21/823418

USPC .......... 257/401, E29.267, E29.269, E21.618, 257/E21.619; 438/302, 305, 306
See application file for complete search history.

(56) References Cited

U.S. PATENT DOCUMENTS

| 5,057,443 A | 10/1991 | Hutter |
| 6,686,637 B1 | 2/2004 | Dokumaci et al. |

(Continued)

FOREIGN PATENT DOCUMENTS

| GB | 2434030 B | 1/2008 |
| KR | 20090118935 A | 11/2009 |
| WO | 2004100230 A2 | 11/2004 |

OTHER PUBLICATIONS

Hine et al, "A new isolation technology for bipolar devices by low pressure selective silicon epitaxy", IEEE Xplore VLSI Technology, 1982, pp. 116-117.

(Continued)

*Primary Examiner* — Kimberly Rizkallah
*Assistant Examiner* — Maria Ligai
(74) *Attorney, Agent, or Firm* — Michael Le Strange; Hoffman Warnick LLC (57) ABSTRACT

A semiconductor device comprises first and second gate stacks formed on a semiconductor-on-insulator (SOI) substrate. The SOI substrate includes a dielectric layer interposed between a bulk substrate layer and an active semiconductor layer. A first extension implant portion is disposed adjacent to the first gate stack and a second extension implant portion is disposed adjacent to the second gate stack. A halo implant extends continuously about the trench. A butting implant extends between the trench and the dielectric layer. An epitaxial layer is formed at the exposed region such that the butting implant is interposed between the epitaxial layer and the dielectric layer.

9 Claims, 10 Drawing Sheets

(51) Int. Cl.
*H01L 21/84* (2006.01)
*H01L 29/66* (2006.01)
*H01L 29/786* (2006.01)
*H01L 29/06* (2006.01)
*H01L 29/10* (2006.01)
*H01L 29/78* (2006.01)
*H01L 21/8234* (2006.01)
*H01L 21/8238* (2006.01)

(52) U.S. Cl.
CPC ..... *H01L 29/7833* (2013.01); *H01L 29/78609* (2013.01); *H01L 29/78612* (2013.01); *H01L 29/78618* (2013.01); *H01L 29/78621* (2013.01); *H01L 21/823412* (2013.01); *H01L 21/823418* (2013.01); *H01L 21/823807* (2013.01); *H01L 21/823814* (2013.01)

(56) References Cited

U.S. PATENT DOCUMENTS

| | | | |
|---|---|---|---|
| 6,908,822 B2 | 6/2005 | Rendon et al. | |
| 7,230,264 B2 | 6/2007 | Thean et al. | |
| 7,544,997 B2 | 6/2009 | Zhang et al. | |
| 7,601,983 B2 | 10/2009 | Ueno et al. | |
| 7,824,980 B2 | 11/2010 | Hwang | |
| 7,936,042 B2 | 5/2011 | Kumar | |
| 8,148,225 B2 | 4/2012 | Wang et al. | |
| 2007/0252204 A1 | 11/2007 | Wei et al. | |
| 2007/0275514 A1 | 11/2007 | Itou | |
| 2008/0299724 A1 | 12/2008 | Grudowski et al. | |
| 2009/0026552 A1 | 1/2009 | Zhang et al. | |
| 2009/0242995 A1* | 10/2009 | Suzuki | H01L 21/823412 257/368 |
| 2009/0278201 A1 | 11/2009 | Chatty et al. | |
| 2010/0025743 A1 | 2/2010 | Hoentschel et al. | |
| 2010/0193873 A1 | 8/2010 | Griebenow et al. | |
| 2010/0224938 A1 | 9/2010 | Zhu | |
| 2011/0278674 A1 | 11/2011 | Hook et al. | |
| 2011/0316093 A1 | 12/2011 | Yang et al. | |
| 2012/0086077 A1* | 4/2012 | Fried | H01L 21/26586 257/347 |
| 2012/0112280 A1 | 5/2012 | Johnson et al. | |
| 2012/0187490 A1 | 7/2012 | Fried et al. | |

OTHER PUBLICATIONS

Lo et al., "PD-SOI Mosfet Body-to-Body Leakage Scaling Trend and Optimization", 2008 IEEE International SOI Conference Proceedings, pp. 49-50.
PCT Written Opinion of the International Searching Authority, PCT Application No. PCT/US2011/060084, May 24, 2012, pp. 1-9.

* cited by examiner

SEMICONDUCTOR DEVICE INCLUDING SIU BUTTED JUNCTION TO REDUCE SHORT-CHANNEL PENALTY

DOMESTIC PRIORITY

This application is a division of U.S. patent application Ser. No. 14/047,189, filed Oct. 7, 2013, the disclosure of which is incorporated by reference herein in its entirety.

FIELD OF THE INVENTION

The present invention relates generally to a semiconductor-on-insulator (SOI) junction isolation structure, and more particularly, a semiconductor device including a SOI junction to reduce short-channel penalty.

BACKGROUND

Integrated circuits fabricated in SOI technology rely on electrically isolating similar-type FETs located adjacent to one another. Multi-gate semiconductor devices, e.g., similar-type stacked transistors disposed next to one another, are a common configuration in electrical circuits. As the size of semiconductor integrated circuits continue to decrease, current methods for isolating multi-gate semiconductor devices may cause FET-to-FET body leakage and increased short-channel effects.

Recent trends have moved toward reducing the channel length while attempting to maintain the thickness of the SOI package. Conventional semiconductor device fabrication processes have attempted to address short-channel effect issues by epitaxially growing source/drain regions instead of forming source/drain regions by ion implantation processes. Epitaxy allows formation of deep source drain regions with minimal to no lateral dopant diffusion. The process of epitaxially growing the source/drain regions requires a semiconductor seed layer, such as a silicon seed layer, to be used as a template for the crystalline epitaxial growth. The seed layer has opposite doping with respect to the source/drain. Therefore, the seed layer requires an implant to fully butt the junctions. At narrow pitch and short lengths, however, combining butting implants with the conventional source/drain epitaxially growth process causes back channel leakage effect. Furthermore, at higher energy and high implant doses, the butting implant can damage the seed layer and negatively impact the epitaxial growth.

SUMMARY

According to at least one exemplary embodiment of the present invention, a multi-gate semiconductor device comprises first and second gate stacks for stacked transistors formed on a semiconductor-on-insulator (SOI) substrate. The SOI substrate includes a dielectric layer interposed between a bulk substrate layer and an active semiconductor layer. A first extension implant portion is disposed adjacent to the first gate stack and a second extension implant portion is disposed adjacent to the second gate stack. A halo implant extends continuously about the trench. A butting implant extends between the trench and the dielectric layer. An epitaxial layer is formed at the exposed region such that the butting implant is interposed between the epitaxial layer and the dielectric layer.

In another embodiment, a method of fabricating a semiconductor device comprises forming a plurality of gate stacks on a semiconductor-on-insulator (SOI) substrate. The method further comprises implanting a first dopant at the active semiconductor layer to form an extension implant extending between a first gate stack and a second gate among the plurality of gate stacks. The method further comprises applying a spike anneal to the extension implant, and etching the region of the active semiconductor layer to form a trench that extends through the extension implant and exposes trench surfaces of the active semiconductor layer. The method further includes implanting a second dopant at the trench surfaces to form a halo implant that surrounds the trench. The second implant is of opposite type (e.g., dopant type) with respect to the implant. The method further includes applying a furnace anneal different from the spike anneal. The method further comprises implanting a third dopant at the exposed region to form a butting implant that extends between the trench and the dielectric layer. The method further comprises growing an epitaxial layer at the exposed region such that the butting implant is interposed between the epitaxial layer and the dielectric layer.

Additional features are realized through the techniques of the present invention. Other embodiments of the inventive concept are described in detail herein and are considered a part of the claimed invention.

BRIEF DESCRIPTION OF THE SEVERAL VIEWS OF THE DRAWINGS

The subject matter which is regarded as the invention is particularly pointed out and distinctly claimed in the claims at the conclusion of the specification. The forgoing and other features of the invention are apparent from the following detailed description taken in conjunction with the accompanying drawings. FIGS. 1-9 illustrate a series of operations to fabricate a semiconductor device in which:

DETAILED DESCRIPTION

Figure 1:
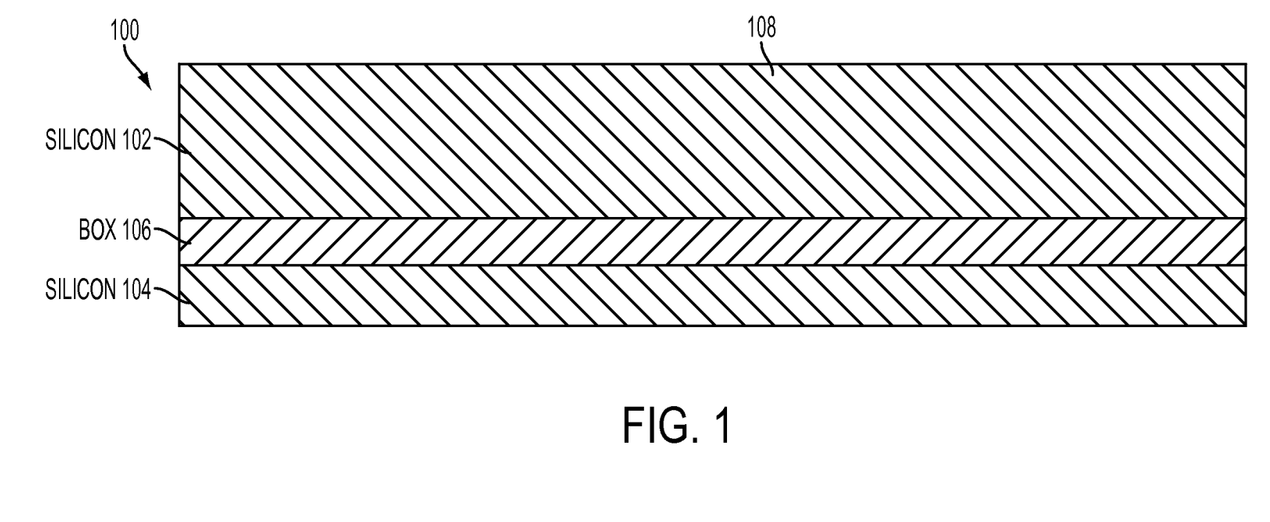
FIG. 1 illustrates a starting semiconductor-on-insulator (SOI) substrate.

Referring now to FIG. 1, a starting semiconductor-on-insulator (SOI) substrate 100 is illustrated. The starting SOI substrate 100 includes an active semiconductor layer 102 separated from a bulk substrate layer 104 by a buried dielectric layer 106. In at least one exemplary embodiment, the active semiconductor layer 102 and the bulk substrate layer 104 are formed from silicon, and the buried dielectric layer 106 is a buried oxide (BOX) layer formed from silicon oxide ($SiO_2$). The starting SOI substrate 100 may be utilized to form a field effect transistor (FET) including, but not limited to, a PFET and NFET. With respect to a PFET, the active semiconductor layer 102 is undoped or lightly doped N-type. For an NFET, active semiconductor layer 102 is undoped or lightly doped P-type. In one example, the dopant concentration of the active semiconductor layer 102 is about $1E^{17}$ atoms per cubic centimeter ($atm/cm^3$) to about $1E^{19}$ $atm/cm^3$. The active semiconductor layer 102 has a thickness that ranges from about 20 nanometers (nm) to about 200 nm. A horizontal direction (including length and width) is defined as a direction parallel to a planar surface 108. A vertical direction (including depth and height) is defined as a direction perpendicular to the horizontal direction.

Figure 2:
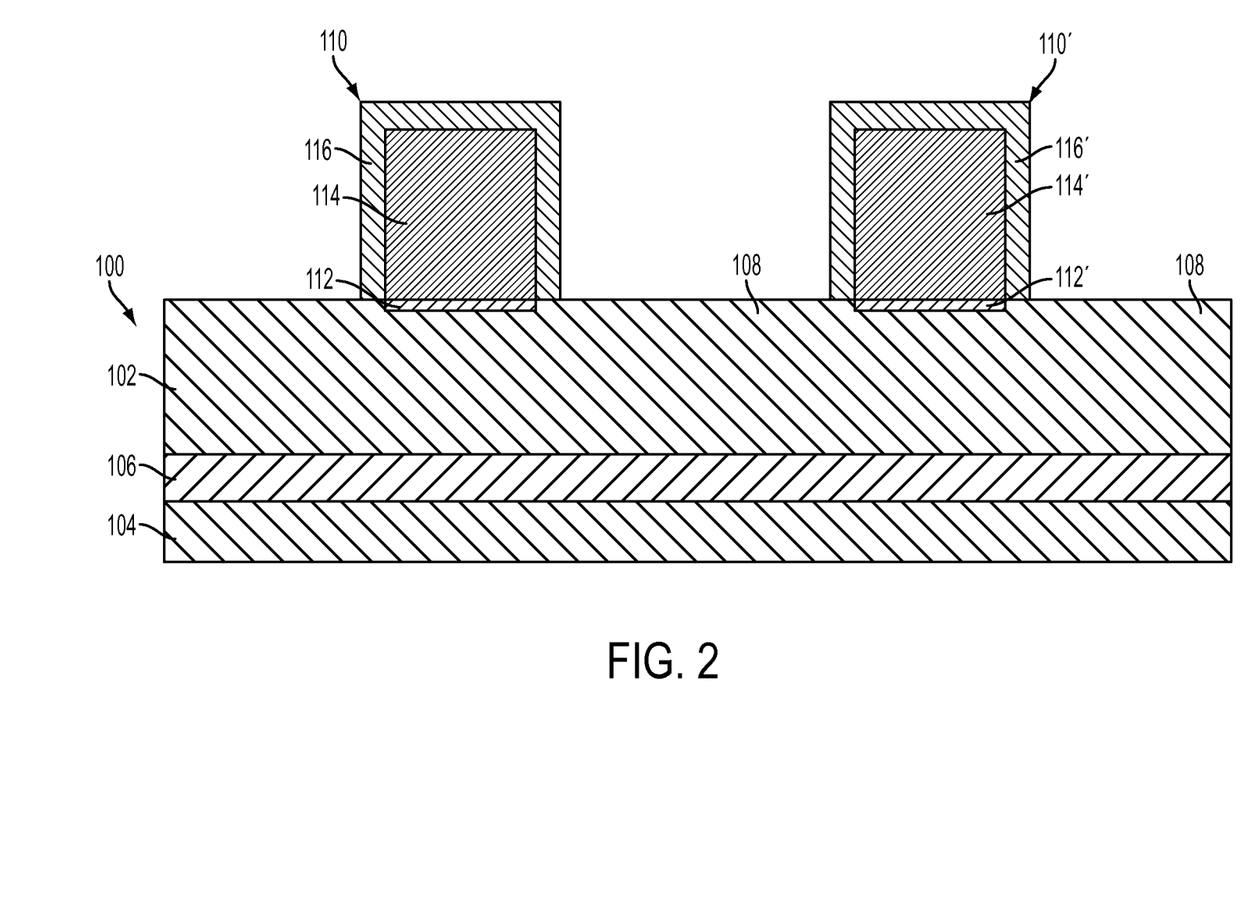
FIG. 2 illustrates the SOI substrate of FIG. 1 following formation of first and second gate stacks on an active semiconductor layer of the SOI substrate.

Turning to FIG. 2, a first gate stack 110 and a second gate stack 110' are formed at the active semiconductor layer 102 of the starting SOI substrate 100. Accordingly, at least one exemplary embodiment provides a multi-gate semiconductor device having a plurality of gate stacks. The gate stacks 110, 110' may be formed according to various gate fabrications process well-known to those of ordinary skill in the art. Each of the first and second gate stacks 110, 110' may comprise a respective gate layer 114, 114'. The gate layer 114, 114' may include a gate dielectric layer and a gate conductor layer over the gate dielectric layer. The gate dielectric layer may include, but is not limited to, a high dielectric constant (high-k) material. Examples of high-k materials include, but are not limited, to metal oxides such as $Ta_2O_5$, $BaTiO_3$, $HfO_2$, $ZrO_2$, $Al_2O_3$, metal silicates such as $HfSi_xO_y$, or $HfSi_xO_yN_z$ and combinations of layers thereof. In one example, the gate dielectric layer has a thickness ranging from about 0.5 nanometers (nm) to about 1.5 nm. The gate conductor layer may include one or more of polysilicon and a metal gate material, for example. The gate stacks 110, 110' may be spaced apart from one another by a distance ranging from about 80 nm to about 260 nm.

A spacer layer 116, 116' may be formed on the respective gate stacks 110, 110' as further illustrated in FIG. 2. The spacer layers 116, 116' may be formed from a blanket conformal spacer material including, but not limited to, silicon nitride. Although not illustrated in FIG. 2, the spacer layers 116, 116' may undergo an etching process, such as a reactive ion etch (RIE) process, to remove the conformal layer from horizontal surfaces while the conformal layer on vertical surfaces is not removed or partially removed such that individual side-wall spacers are formed on the gate stacks 110, 110'.

In at least one embodiment, the gate stacks may include a gate dielectric layer 112, 112' that is formed near the planar surface 108 of the active semiconductor layer 102 and below the gate layer 114, 114'. The gate dielectric layer 112, 112' may isolate a respective gate stack 110, 110' from the active semiconductor layer 102. The gate dielectric layer 112, 112' may be formed, for example, according to an oxidation process as understood by those ordinarily skilled in the art.

Figure 3:
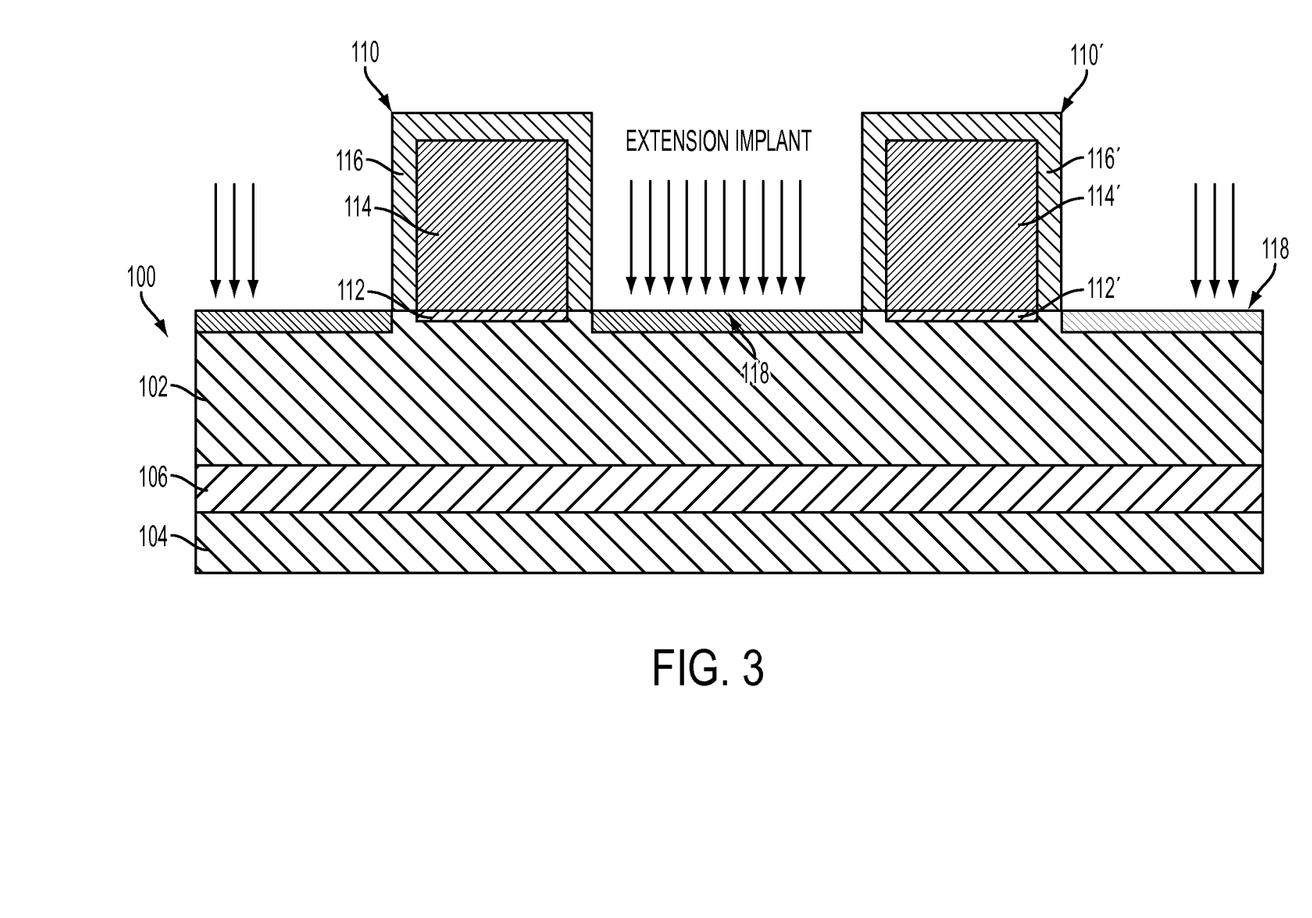
FIG. 3 illustrates the SOI substrate of FIG. 2 undergoing an ion implantation process to form an extension implant at the active semiconductor layer between the first and second gate stacks.

Turning now to FIG. 3, an extension implant 118 is formed in the active semiconductor layer 102. The extension implant 118 may be formed by implanting doped ions in the active semiconductor layer 102. In at least one embodiment, the doped ions may be implanted at an angle of less than 90 degrees relative to the planar surface 108. When forming a PFET, the ions are P-type ions, whereas the ions are N-type ions when forming an NFET.

Figure 4:
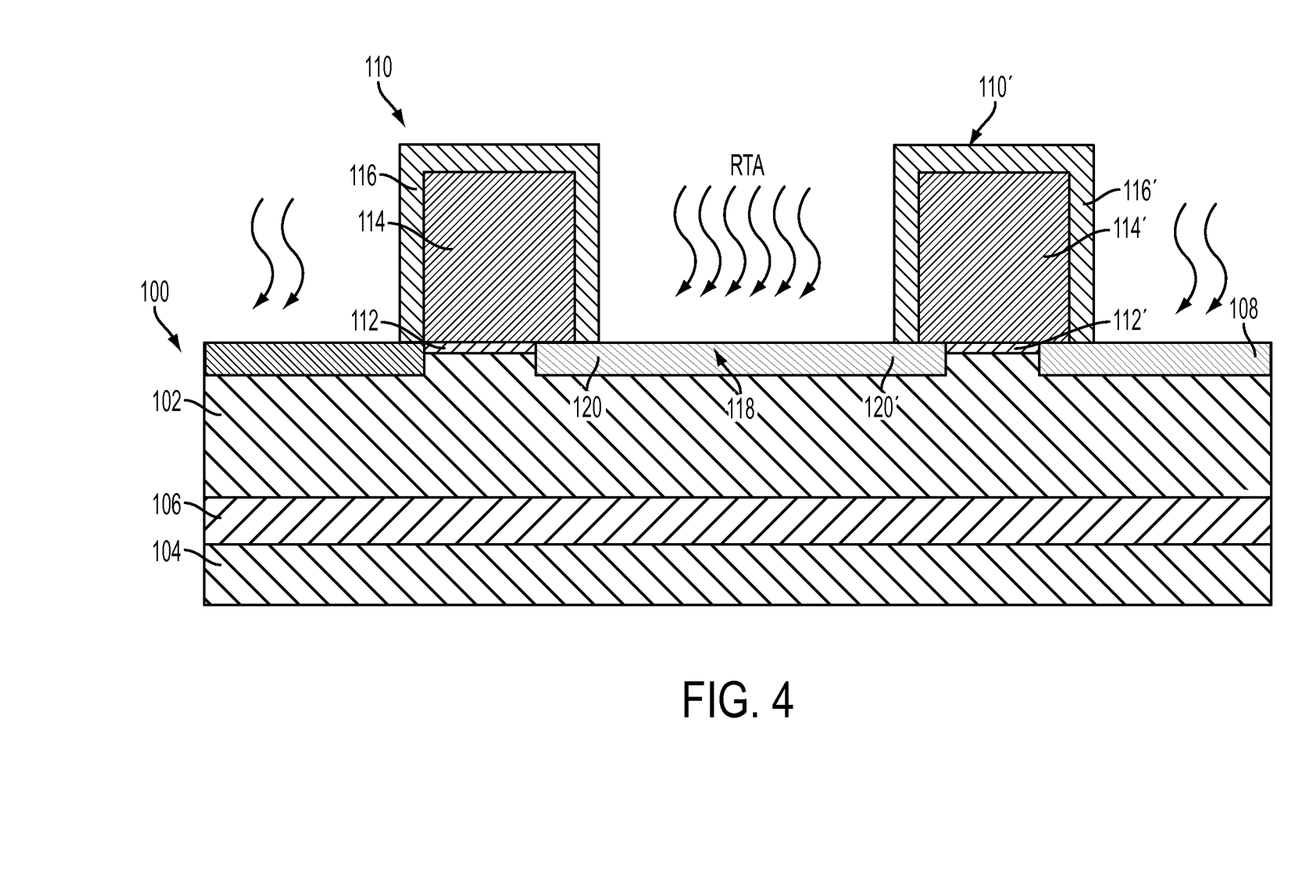
FIG. 4 illustrates the SOI substrate of FIG. 3 undergoing a spike annealing process to anneal the extension implant.

Referring now to FIG. 4, a rapid thermal annealing process, i.e., a spike anneal, is applied to the extension implant 118. The spike anneal is applied quickly to the extension implant 118 and at a high temperature. In at least one embodiment, the spike anneal is applied for time duration ranging from about 5 seconds to about 30 seconds, and at a temperature ranging from about 800 degrees Celsius (° C.) to about 1170° C. Unlike the conventional art, at least one exemplary embodiment of the disclosure performs the spike anneal on the extension implant 118, which excludes a halo implant. In response to the spike anneal, the extension implant 118 extends laterally, i.e., in a direction parallel to the length of the SOI substrate 100.

In an exemplary embodiment, opposing ends of the extension implant 118 overlap the gate layer 114, 114' of the first and second gate stacks 110, 110', respectively. More specifically, in response to the spike anneal, a first end 120 of the extension implant 118 extends beyond the spacer layer 116, 116' of the first gate stack 110, 110' and beneath the respective first gate layer 114, 114'. A second end 120' of the extension implant 118 extends beyond the spacer layer 116, 116' of the second gate stack 110' and beneath the respective second gate layer 114'. In another embodiment, the first and second ends 120, 120' of the extension implant 118 do not extend beyond the spacer layer 116, 116' of the respective gate stacks 110, 110', i.e., the first and second ends 120, 120' are underlapped with respect to the gate layer 114, 114'. For example, the first and second ends 120, 120' may be aligned with a junction existing between an edge of the spacer layer 116, 116' and the adjacent gate layer 114, 114' without extending beneath the spacer layer 116, 116'. However, the underlapping formation of the extension implant 118 is not limited to being aligned with the edge of the spacer layer 116, 116'.

Figure 5:
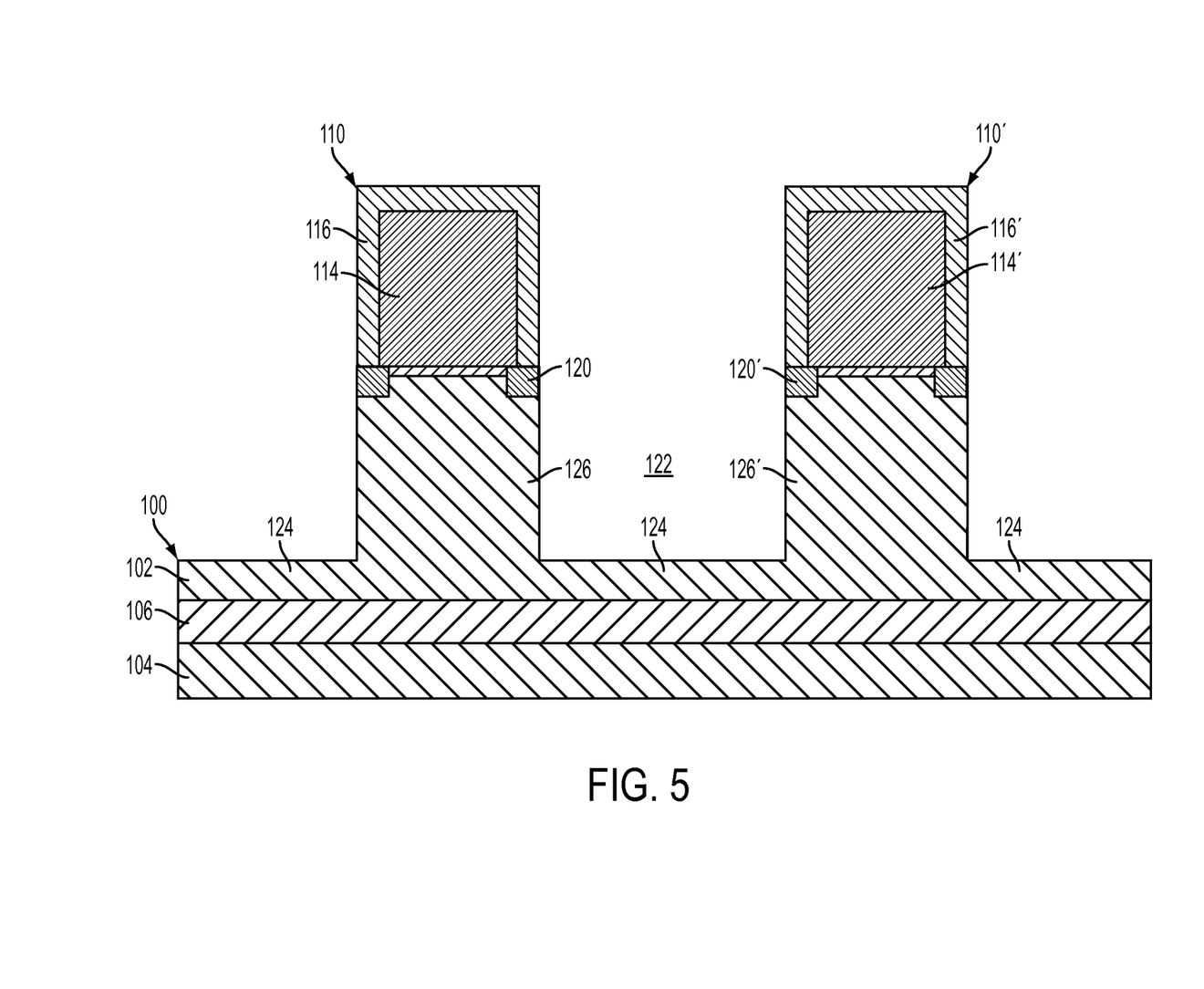
FIG. 5 illustrates the SOI substrate of FIG. 4 following an etching process to form a trench between the first and second gate stacks.

Turning now to FIG. 5, a trench 122 is formed into the active semiconductor layer 102 and between the first and second gate stacks 110, 110', which exposes one or more trench surfaces. The trench surfaces include a planar region 124 of the active semiconductor layer 102 that extends between the first and second gate stacks 110, 110'. The trench 122 may be formed using, for example, a reactive ion etch (RIE) process selective to etch the active semiconductor with respect to the spacer layer 116, 116'. In at least one embodiment illustrated in FIG. 5, the trench 122 does not extend to the buried dielectric layer 106. That is, a portion of the active semiconductor layer 102 is interposed between the trench 122 and the buried dielectric layer 106. In at least one embodiment, the distance between the trench 122 and the buried dielectric layer 106 ranges from about 5 nm to about 40 nm. Accordingly, a first trench wall 126 extends from the planar surface 108 of the first gate stack 110 to the exposed region 124, and a second trench wall 126' extends from the planar surface 108 of the second gate stack 110' to the exposed region 124.

Figure 6:
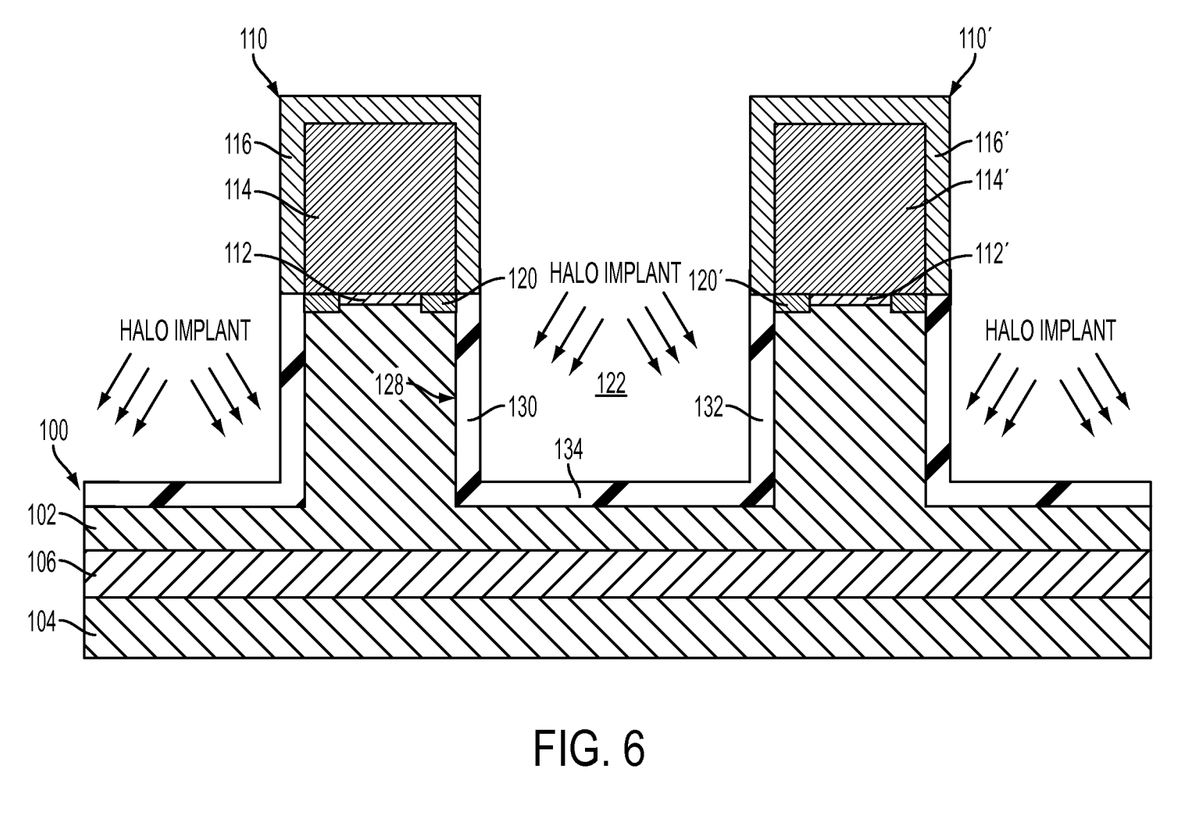
FIG. 6 illustrates the SOI substrate of FIG. 5 undergoing an ion implantation process to form a halo implant at surfaces of the active semiconductor layer exposed by the trench according to a first exemplary embodiment.

Turning to FIG. 6, a halo implant 128 is formed at the first and second walls and the exposed region 124 of the active semiconductor layer 102. Although the halo implant 128 is illustrated as being formed uniformly at the edges of the exposed region 124, it is appreciated that the dimensions of the halo implant 128 may be non-uniformly formed. For an N-FET the halo is formed of P-type material, and for a P-FET the halo is formed of N-type material. Accordingly, unlike the conventional art where a halo implant 128 is formed directly after forming an extension implant 118 and/or prior to a spike anneal, at least one embodiment of the disclosure forms a halo implant 128 after performing a spike anneal for the extension implant 118, and after forming the trench 122 to define the first and second walls 126, 126'. That is, at least one embodiment of the disclosure postpones forming the halo implant 128 until after recessing the active semiconductor layer 102, i.e., after forming the trench 122. Accordingly, the halo implant 128 is not lost when recessing the active semiconductor layer 102. Further, postponing the formation of the halo implant 128 until after the trench is formed preserves the halo implant 128, and allows for a halo implant 128 to be used effectively in combination with a butting implant, as discussed in greater detail below.

In at least one embodiment, the halo implant 128 continuously extends about the trench. Accordingly, the halo implant 128 exists at substantially all portions of the first and second walls 126, 126' and exposed region 124 of the active semiconductor layer 102. In other words, the halo implant 128 may be formed at the walls 126, 126' and the exposed region 124, and interposed between the active semiconductor layer and the opening formed by the trench 122. The halo implant 128 may include first vertical portion 130 formed at the first wall 126, a second vertical portion 132 formed at the second wall 126', and a lower portion 134 formed at the exposed region 124. The dopant concentrations of the first and second vertical portions 130, 132 and the exposed region 124 may extend into the active semiconductor layer 102 at a uniform distance.

Figure 7:
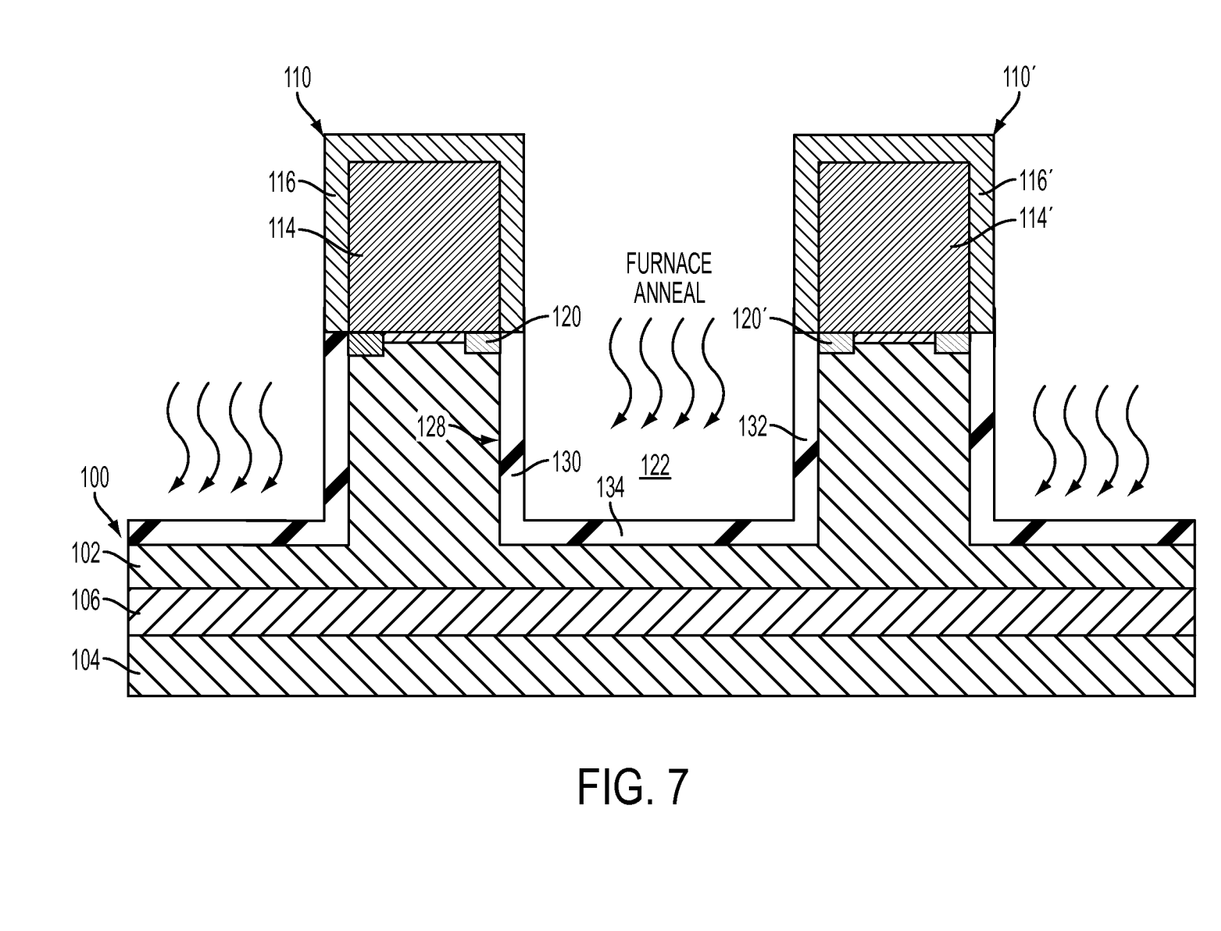
FIG. 7 illustrates the SOI substrate of FIG. 6 undergoing a furnace annealing procedure.

A furnace annealing process, i.e., a furnace anneal, may be performed after forming the trench 122. As illustrated in at least one exemplary embodiment of FIG. 7, the furnace anneal is performed after the trench 122 is formed and after forming the halo implant 128, and cures defects in the exposed region 124 of the active semiconductor layer 102. The furnace anneal is applied for a longer period of time and at a lower temperature as compared to the spike anneal applied to the extension implant 118. In at least one embodiment, the furnace anneal is applied for time duration ranging from about 5 minutes to about 20 minutes, and at a temperature ranging from about 500 C.° to about 1000 C.°. It is appreciated, however, that other temperature ranges may be applied.

Figure 8:
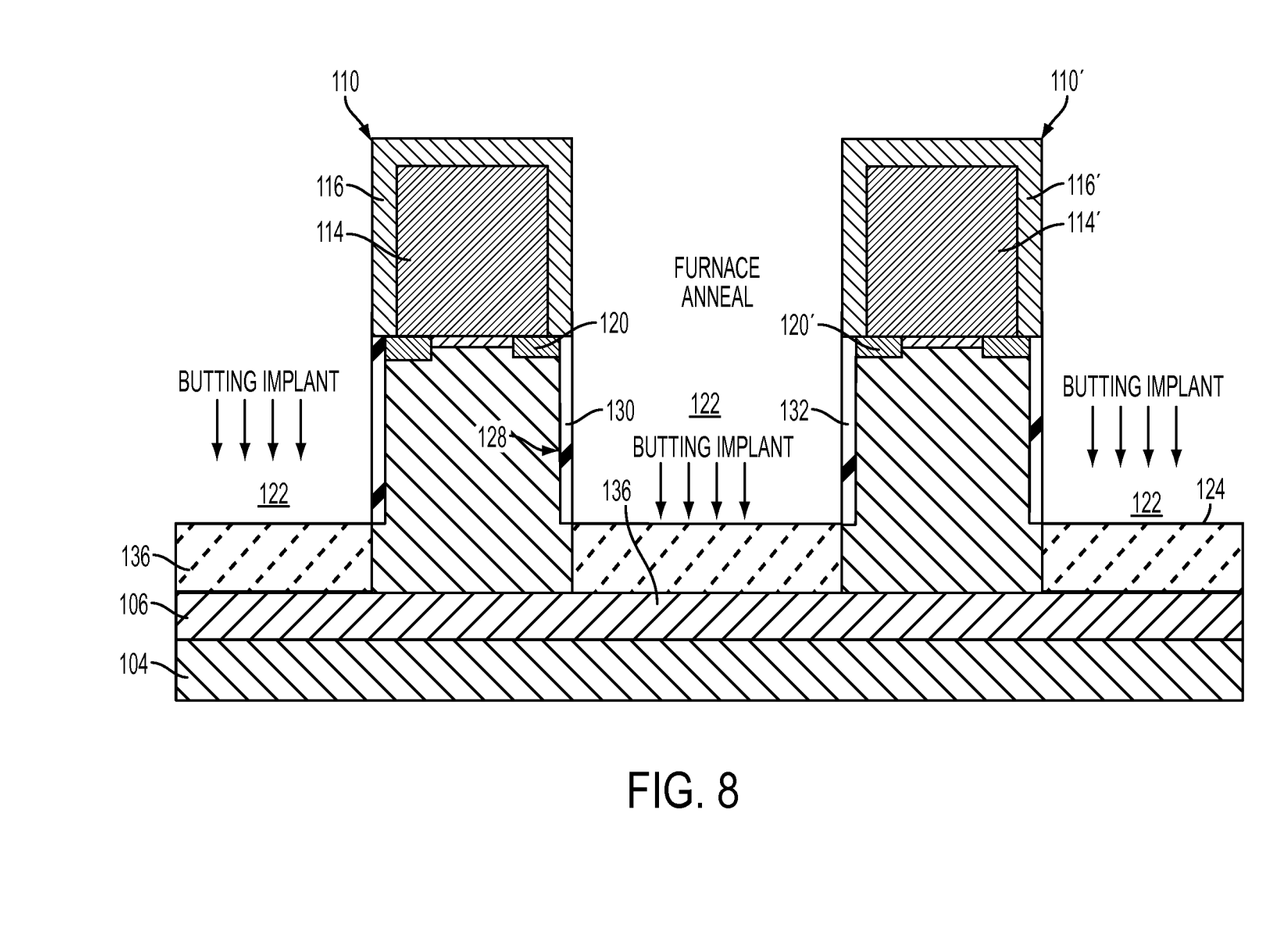
FIG. 8 illustrates the SOI substrate 7 undergoing an ion implantation process to form a butting implant at the active semiconductor layer between the first and second gate stacks.

Referring to FIG. 8, an ion implantation is applied to the exposed region 124 of the active semiconductor layer 102. As a result, butting implants 136 are formed on the exposed region 124. The butting implants 136 may abut the buried dielectric layer 106, as further illustrated in FIG. 8. The butting implant 136 is formed with a dopant that is opposite the dopant included in the active semiconductor layer 102. Accordingly, the butting implant 136 increases the resistance in the body of the active semiconductor layer 102 between the adjacent gate stacks 110, 110' or creates a electrostatic barrier between the bodies of the 2 transistors to reduce FET-to-FET body leakage.

In at least one embodiment, the butting implant may overlap the lower portion of the halo implant 128. When forming a PFET, the exposed region 124 is doped with P-type ions, whereas the exposed region 124 is doped with N-type ions when forming an NFET. In at least one embodiment of the disclosure, a furnace anneal is performed after forming the butting implant 136 (i.e., prior to growing an epitaxial layer) to cure any defects in the exposed region 124 of the active semiconductor layer 102. Applying the furnace anneal to the exposed region 124 of the active semiconductor layer 102 after forming the trench 122 unexpectedly achieves effective growth of the epitaxial layer 138 even though a butting implant 136 is formed in the trench 122, as discussed in greater detail below. In another embodiment, the furnace anneal may be performed before forming the butting implant.

Figure 9:
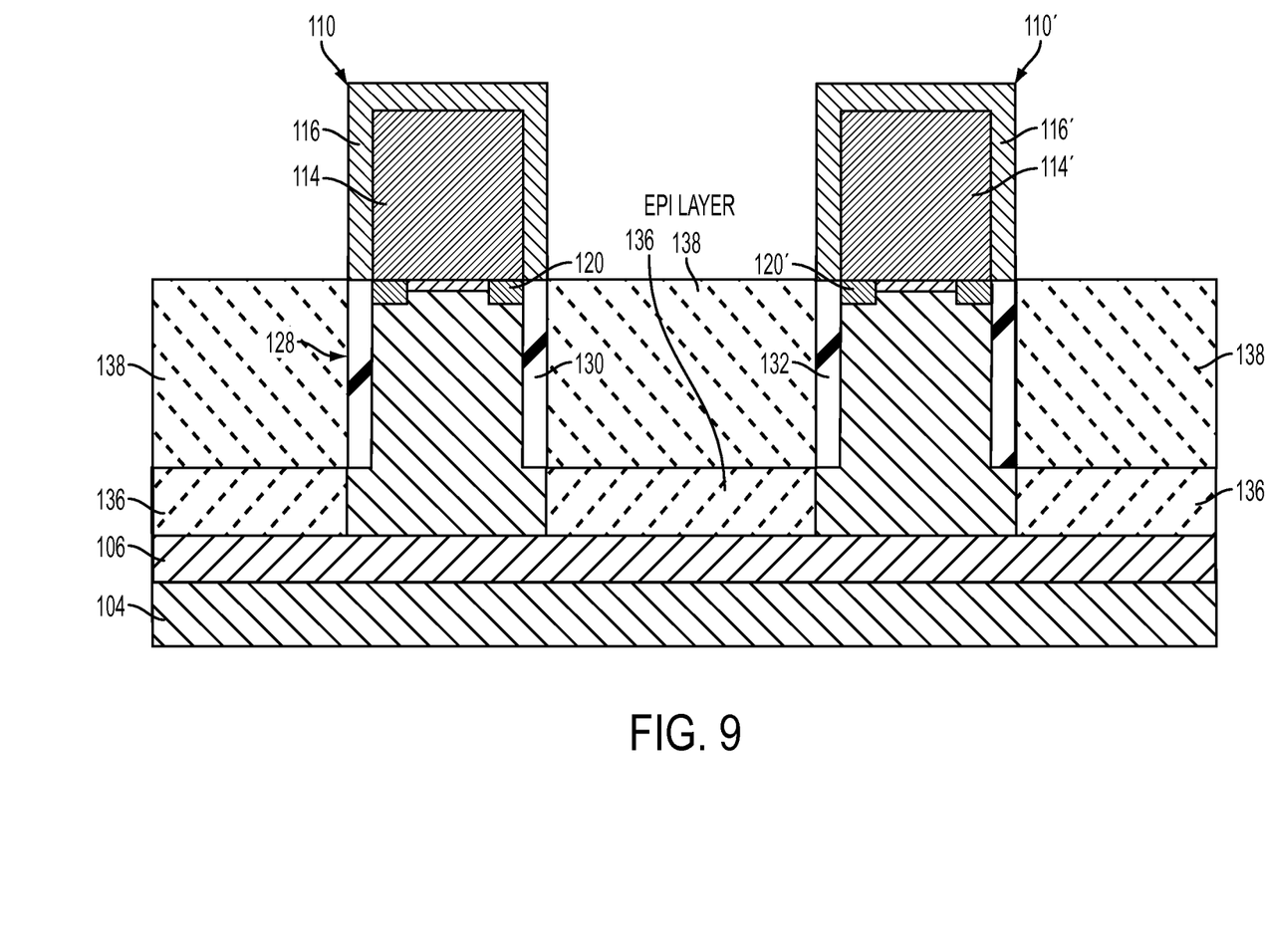
FIG. 9 illustrates the SOI substrate of FIG. 8 following formation of an epitaxial layer on an exposed region of the active semiconductor layer in the trench.

Turning now to FIG. 9, an epitaxial layer 138 is grown in the trench 122 and on the exposed region 124 of the active semiconductor layer 102. As discussed above, the furnace anneal may be performed after forming the trench 122 thereby curing defects existing at the exposed region 124 of the active semiconductor layer 102. Accordingly, the furnace anneal provides a more reliable seeding layer to grow the epitaxial layer 138, while still allowing for the use of the butting implant 136. That is, applying the furnace anneal to the exposed region 124 of the active semiconductor layer 102 after forming the trench 122 unexpectedly recrystallizes damaged silicon of the epitaxial layer 138 even though the butting implant 136 is formed in the trench 122. Therefore, improved epitaxial growth may be achieved.

The epitaxial layer 138 may include, but is not limited to, epitaxial silicon (Si), epitaxial silicon-germanium or epitaxial silicon carbide. When forming a PFET and/or an NFET, the epitaxial layer 138 may be highly doped P-type, highly doped N-type. It may appreciated, however, that the doping may be have an initial net zero doped or may be intrinsically doped. The epitaxial layer 138 has a thickness ranging from about 10 nm to about 100 nm. In one example, the dopant type and the dopant concentration of epitaxial layer 138 is substantially the same as the active semiconductor layer 102. The dopant concentration may range from about 5E17 atm/cm3 to about 1E21 atm/cm3. The dopant type of epitaxial layer 138 may be the opposite type of the dopant type corresponding to the active semiconductor layer 102. After forming the epitaxial layer 138, an anneal process may be performed. Thereafter, a normal fabrication process for completing the NFET or PFET may be performed as understood by those ordinarily skilled in the art.

Figure 10:
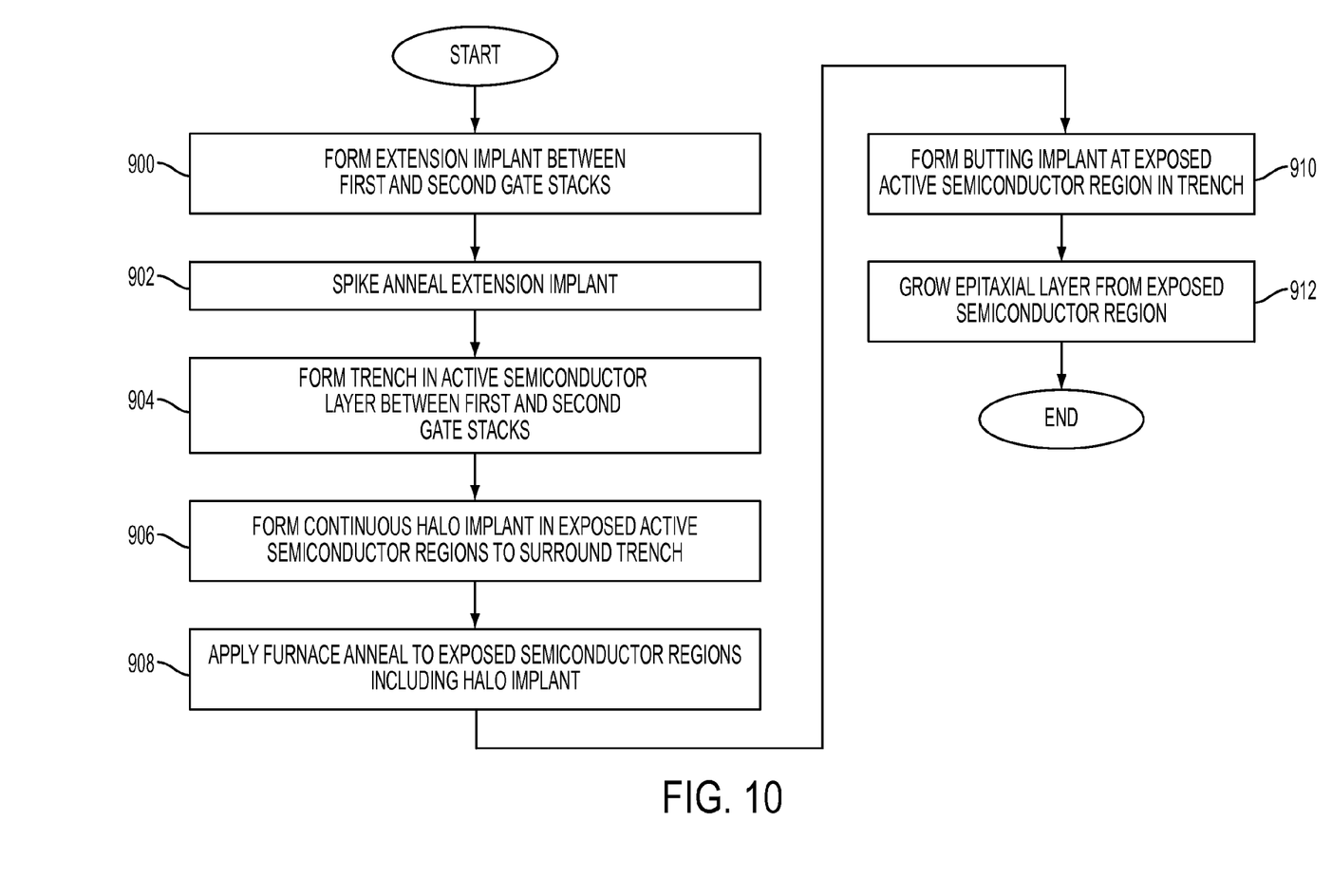
FIG. 10 is a flow diagram illustrating a method of fabricating a semiconductor device according to an exemplary embodiment of the disclosure.

Turning now to FIG. 10, a flow diagram illustrates a method of fabricating a semiconductor device according to an exemplary embodiment of the disclosure. At operation 900, an extension implant is formed, which extends between a first gate stack and a second gate. The extension implant may be formed, for example, by implanting a first dopant at the active semiconductor layer of a SOI substrate. At operation 902, a spike anneal is applied to the extension implant. In response to the spike anneal, first and second opposing ends of the extension implant extend laterally toward the first and second gate stacks, respectively. At operation 904, a trench is formed in the active semiconductor layer between the first and second gate stacks. The trench extends through the extension implant and exposes trench surfaces of the active semiconductor layer. At operation 906, a continuous halo implant is formed that surrounds the trench. The halo implant may be formed, for example, by implanting a second dopant at the exposed surfaces of the active semiconductor layer exposed by the trench. At operation 908, a furnace anneal is applied to the exposed surfaces including the halo implant. The furnace anneal is different from the spike anneal, and cures one or more defects existing in the active semiconductor layer. At operation 910, a butting implant is formed in the trench and between the first and second gate stacks. The butting implant may be formed by implanting a third dopant at a lower surface of the active semiconductor layer exposed by the trench. At operation 912, an epitaxial layer is grown at the exposed lower region such that the butting implant is interposed between the epitaxial layer and the dielectric layer, and the method ends.

Accordingly, at least one embodiment described in detail above forms a halo implant in exposed active semiconductor surfaces that are exposed by forming a trench in the active semiconductor layer. After forming the trench, a furnace anneal is applied to the exposed active semiconductor surfaces. The furnace anneal provides unexpected results in that an epitaxial layer may be formed on an exposed active semiconductor layer including a butting implant. Accordingly, the furnace anneal allows for fabrication of a semiconductor device having a butting implant interposed between an epitaxial layer and the dialectic layer that reduces short-channel effect.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The flow diagrams depicted herein are just one example. There may be many variations to this diagram or the operations described therein without departing from the spirit of the invention. For instance, the steps may be performed in a differing order or steps may be added, deleted or modified. All of these variations are considered a part of the claimed invention.

While the preferred embodiment to the invention had been described, it will be understood that those skilled in the art, both now and in the future, may make various improvements and enhancements which fall within the scope of the claims which follow. These claims should be construed to maintain the proper protection for the invention first described.

What is claimed is:

1. A semiconductor device, comprising:
   first and second gate stacks formed on a semiconductor-on-insulator (SOI) substrate, the SOI substrate including a dielectric layer interposed between a bulk substrate layer and an active semiconductor layer;
   first and second extension implants formed in the active semiconductor layer, the first extension implant portion disposed adjacent to the first gate stack and the second extension implant portion disposed adjacent to the second gate stack;
   a trench having opposing sidewalls that extend between the first and second gate stacks;
   conformal halo implants that extends continuously about the trench and conforms entirely to each opposing sidewall without extending beneath the first and second gate stacks, the conformal halo implants including a portion that contacts a respective extension implant without contacting the dielectric layer;
   a butting implant that extends through a bottom portion of the conformal halo implant and reaches the dielectric layer such that the butting implant extends between the trench and the dielectric layer; and
   an epitaxial layer formed at exposed source/drain regions, the butting implant interposed between the epitaxial layer and the dielectric layer.

2. The semiconductor device of claim 1, wherein each conformal halo implant includes a first portion extending between the first gate stack and the dielectric layer and a second portion extending between the second gate stack and the dielectric layer.

3. The semiconductor device of claim 2, wherein the first portion extends between a respective extension implant and the dielectric layer, the second portion that extends between a second end of the extension implant and the dielectric layer; and a third portion of the conformal halo implant that extends between the trench and the dielectric layer.

4. The semiconductor device of claim 3, wherein the butting implant overlaps the third portion of the conformal halo implant.

5. The semiconductor device of claim 4, wherein the first and second extension implant portions overlap the first and second gate stacks, respectively.

6. The semiconductor device of claim 5, wherein the first and second extension implant portions underlap the first and second gate stacks, respectively.

7. The semiconductor device of claim 6, wherein the conformal halo implant is formed in sidewalls of the trench and the butting implant is formed at a bottom of the trench, the butting implant formed at an angle different with respect to the conformal halo implant.

8. The semiconductor device of claim 3, wherein the first and second extension implants comprise a N-type dopant, the butting implant comprises a P-type dopant, and the active semiconductor layer comprises a N-type dopant to form a NFET semiconductor device.

9. The semiconductor device of claim 3, wherein the first and second extension implants comprise a P-type dopant, the butting implant comprises a N-type dopant, and the active semiconductor layer s comprises a P-type dopant to form a PFET semiconductor device.

* * * * *